(12) United States Patent
Li et al.

(10) Patent No.: US 7,501,353 B2
(45) Date of Patent: Mar. 10, 2009

(54) METHOD OF FORMATION OF A DAMASCENE STRUCTURE UTILIZING A PROTECTIVE FILM

(75) Inventors: Wai-Kin Li, Beacon, NY (US); Wu-Song Huang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 248 days.

(21) Appl. No.: 11/615,272

(22) Filed: Dec. 22, 2006

(65) Prior Publication Data

US 2008/0153296 A1    Jun. 26, 2008

(51) Int. Cl.
*H01L 21/20* (2006.01)

(52) U.S. Cl. .................. 438/778; 438/712; 438/780; 438/781; 438/788; 438/792; 257/E21.252; 257/E21.261; 257/E21.273; 257/E21.576; 257/E21.579

(58) Field of Classification Search ............. 438/623, 438/631, 638, 706, 712, 735, 778–782, 788, 438/792; 257/E21.252, 257, 261, 273, 576, 257/577, 579, 581, 23.167

See application file for complete search history.

(56) References Cited

U.S. PATENT DOCUMENTS

| 6,387,287 | B1 * | 5/2002 | Hung et al. | 216/67 |
| 6,500,770 | B1 * | 12/2002 | Cheng et al. | 438/782 |
| 6,521,542 | B1 * | 2/2003 | Armacost et al. | 438/712 |
| 7,060,634 | B2 * | 6/2006 | Rantala et al. | 438/780 |
| 7,144,827 | B2 * | 12/2006 | Rantala et al. | 438/778 |
| 7,309,654 | B2 * | 12/2007 | Schaller et al. | 438/700 |

* cited by examiner

*Primary Examiner*—Michael S Lebentritt
(74) *Attorney, Agent, or Firm*—Wenjie Li; Ira D. Blecker

(57) ABSTRACT

Disclosed is a method for the formation of features in a damascene process. According to the method, vias are formed in a dielectric layer and then covered by a layer of high molecular weight polymer. The high molecular weight polymer covers the vias but does not enter the vias. A trench is then etched through the high molecular weight polymer and the dielectric layer. Any remaining high molecular weight polymer is then removed.

20 Claims, 7 Drawing Sheets

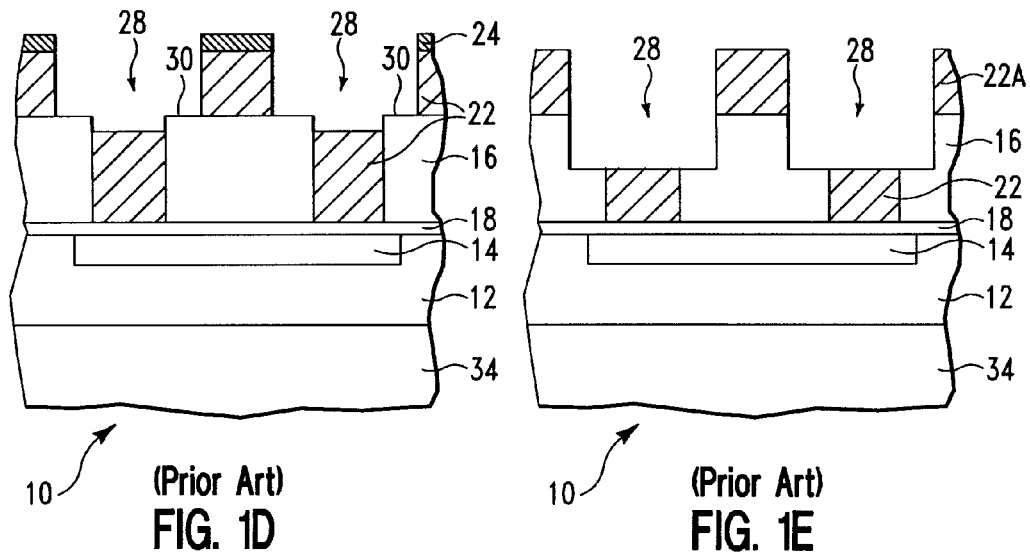
(Prior Art) FIG. 1D
(Prior Art) FIG. 1E
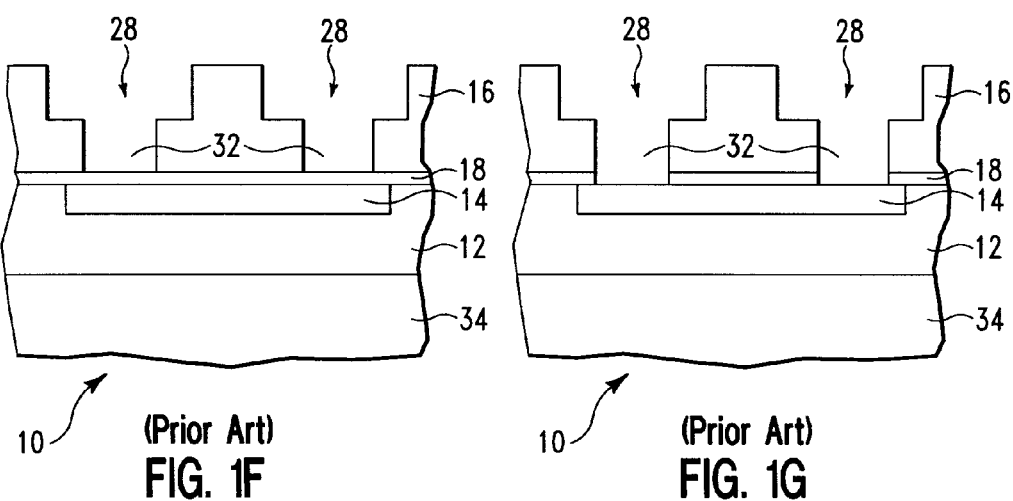
(Prior Art) FIG. 1F
(Prior Art) FIG. 1G

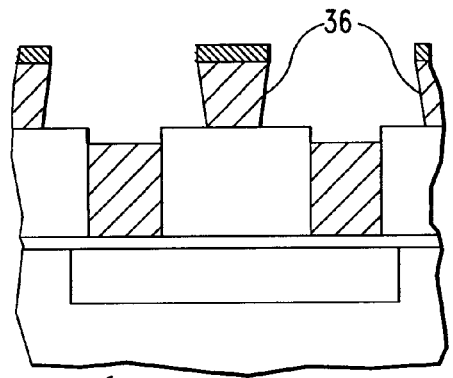 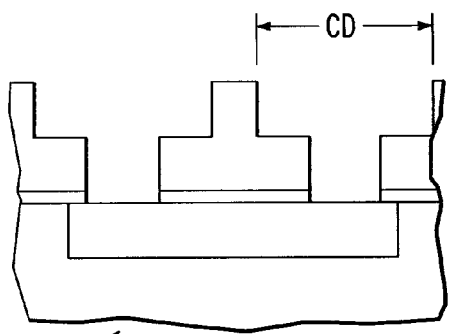
FIG. 2A    FIG. 2B
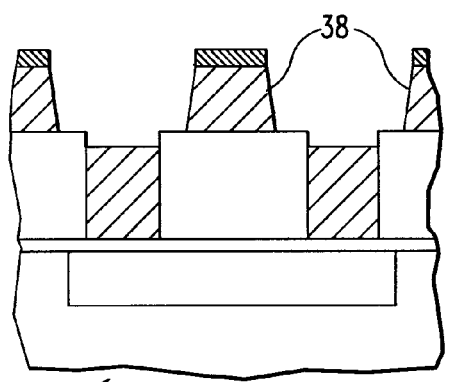 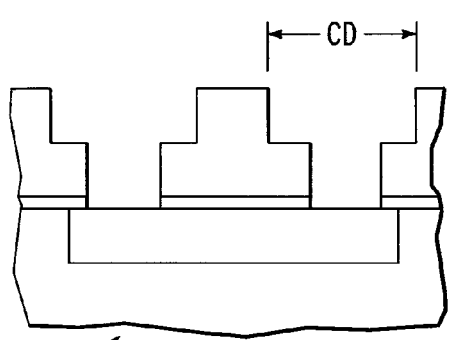
FIG. 3A    FIG. 3B
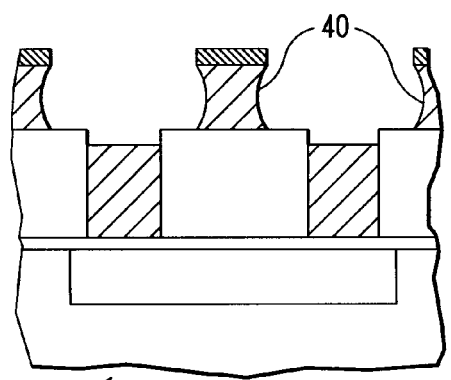 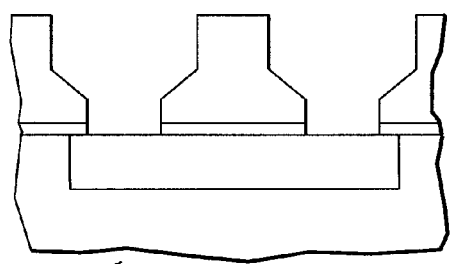
FIG. 4A    FIG. 4B

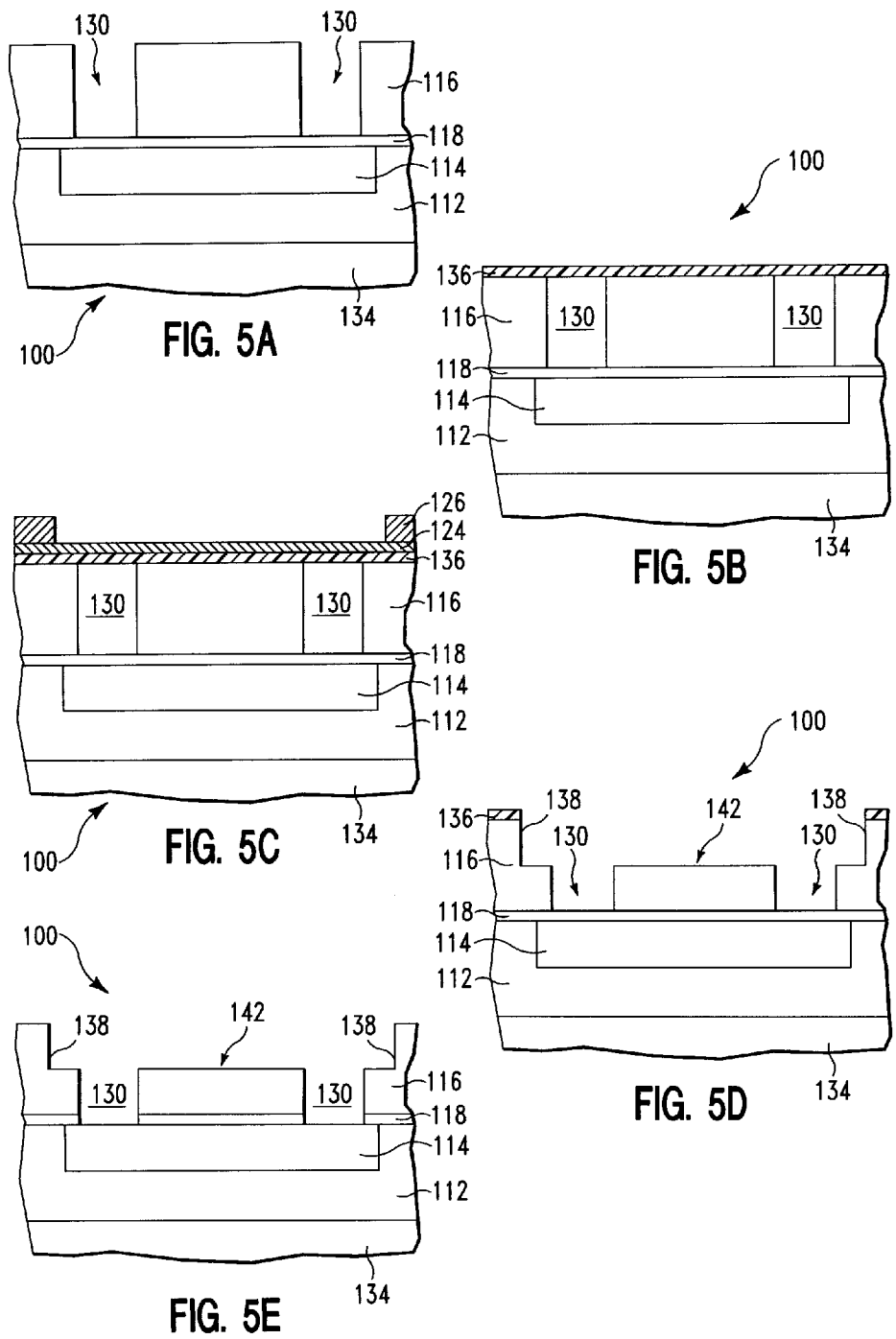

METHOD OF FORMATION OF A DAMASCENE STRUCTURE UTILIZING A PROTECTIVE FILM

BACKGROUND OF THE INVENTION

The present invention relates to the formation of damascene structures on a semiconductor wafer and especially to methods in which an organic film is utilized to protect the underlying dielectric material during etching of the damascene trench.

In damascene processing, the interconnect structure or wiring pattern is formed within a dielectric layer. Using known techniques a photoresist material is used to define the wiring pattern. The patterned photoresist acts as a mask through which a pattern of the dielectric material is removed by a subtractive etch process such as plasma etching or reactive ion etching. The etched openings are used to define wiring patterns in the dielectric layer. The wiring patterns are then filled with a metal using a filling technique such as electroplating, electroless plating, chemical vapor deposition, physical vapor deposition or a combination thereof. Excess metal can then be removed by chemical mechanical polishing through a process known as planarization.

In a single damascene process, via openings are provided in the dielectric layer and filled with a conducting metal, which is often referred to as metallization, to provide electrical contact between layers of wiring levels. In a dual damascene process, the via openings and the wiring pattern are both provided in the dielectric layer before filling with the conducting metal. Damascene processing followed by metallization is continued for each layer until the integrated circuit device is completed.

In the present processing of damascene structures, a so-called planarization material is used to fill the vias after the dielectric has been etched out. The planarization material also protects the vias during subsequent lithographic processing. A spin-on organic planarizing material (protective material) that is presently utilized is NFC 1400, available from JSR Corporation.

However, a problem with the use of spin-on organic planarizing material is that during the subsequent lithographic processing referred to above, the damascene structure can become oversized, undersized or otherwise nonconforming. The difficulties inherent in the use of the spin-on organic planarizing material are described below.

FIGS. 1A through 1G describe the conventional processing of damascene structures using a spin-on organic planarizing material. Referring to FIG. 1A, there is shown a semiconductor structure 10 being prepared for damascene structure. At this stage of the process, semiconductor structure 10 comprises semiconductor wafer 34, a previous wiring level which comprises dielectric 12, metallization 14 and capping layer 18, and the next wiring level which begins with dielectric 16. Dielectric 16 has been previously prepared by forming openings 20 therein by conventional lithographic and etching processing.

Referring now to FIG. 1B, spin-on organic planarizing material 22 is applied in the openings 20 and on the dielectric 16, followed by hard mask 24 (usually a low temperature oxide) and photoresist 26.

In FIG. 1C, the photoresist has been conventionally exposed and developed followed by definition of the hard mask 26 to form openings 28.

Thereafter, as shown in FIG. 1D, there is the spin-on organic planarizing material transfer etch in an $H_2+O_2$ plasma which removes the spin-on organic planarizing material 22 down to or slightly below the surface 30 of the dielectric 12.

Then, semiconductor structure 10 undergoes etching to remove dielectric 16 and enlarge openings 28. The dielectric 16 is etched by a combination of chemicals, for example $CF_4$, $C_4F_8$, $NF_3$, $N_2$, $O_2$, or $NH_3$, using the spin-on organic planarizing material 22A as a mask, and at the same time the hard mask layer 24 is completely removed from the wafer to result in the structure shown in FIG. 1E. Note that spin-on organic planarizing material 22 still remains in the vias at this time.

Referring now to FIG. 1F, the remaining spin-on organic planarizing material 22, 22A is stripped using an $H_2+O_2$ plasma.

Lastly, capping layer 18 is opened using a combination of chemicals, for example $CHF_3$, Ar, $O_2$, $N_2$, to result in the semiconductor structure shown in FIG. 1G.

The processing of semiconductor structure 10 as just described is the ideal structure. The structure as it appears in reality is often quite different. Referring now to FIGS. 2, 3, and 4, there is illustrated the reality of what often happens in the spin-on organic planarizing material transfer etch step of FIG. 1D. In FIG. 2A, the spin-on organic planarizing material transfer etch has caused undercutting of the spin-on organic planarizing material at 36 resulting in an oversized critical dimension (CD) as shown in FIG. 2B.

In FIG. 3A, the spin-on organic planarizing material transfer etch has insufficiently etched the spin-on organic planarizing material at 38 resulting in an undersized CD as shown in FIG. 3B.

In FIG. 4A, the spin-on organic planarizing material transfer etch has caused profile damage of the spin-on organic planarizing material at 40 resulting in profile damage to the semiconductor structure 10 as shown in FIG. 4B.

In view of the foregoing, it would be desirable to have an improved process wherein the spin-on organic planarizing material transfer etch step can be eliminated so that the resulting semiconductor structure does not have an oversized CD, undersized CD or profile damage.

Accordingly, it is a purpose of the present invention to have a process wherein the spin-on organic planarizing material transfer etch step is eliminated to avoid an oversized CD, undersized CD or profile damage.

It is another purpose of the present invention to have a process wherein the spin-on organic planarizing material transfer etch step is eliminated to result in a semiconductor structure which is more manufacturable.

These and other purposes of the invention will become more apparent after referring to the following description of the invention in conjunction with the accompanying drawings.

BRIEF SUMMARY OF THE INVENTION

The purposes of the invention have been achieved by providing, according to a first aspect of the invention, a method for the formation of features in a damascene process, the method comprising the steps of:

providing a semiconductor wafer having a dielectric layer thereon;

forming vias in the dielectric layer;

applying a layer of high molecular weight polymer over the dielectric layer, the high molecular weight layer covering the vias but not entering the vias;

applying a photoresist material to the high molecular weight layer;

patterning the photoresist material so as to expose openings over portions of the high molecular weight layer;

etching the high molecular weight layer and dielectric layer through the openings to form a trench; and removing the remaining photoresist and high molecular weight layer from the dielectric material to form dual damascene openings in the dielectric material.

According to a second aspect of the invention, there is provided a method for the formation of features in a damascene process, the method comprising the steps of:

providing a semiconductor wafer having a dielectric layer thereon;

forming vias in the dielectric layer;

applying a layer of high molecular weight polymer over the dielectric layer, the high molecular weight layer having a diameter of the polymer coil equal to or greater than a diameter of the vias;

applying a photoresist material to the high molecular weight layer;

patterning the photoresist material so as to expose openings over portions of the high molecular weight layer;

etching the high molecular weight layer and dielectric layer through the openings to form a trench; and removing the remaining photoresist and high molecular weight layer from the dielectric material to form dual damascene openings in the dielectric material.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

FIGS. 1A through 1G illustrate an idealized conventional process for forming a semiconductor structure using a protective material.

FIGS. 2A and 2B illustrate the actual structure and the resulting lithographic structure that is formed according to the transfer etch process described with reference to FIG. 1D resulting in an oversized CD.

FIGS. 3A and 3B illustrate the actual structure and the resulting lithographic structure that is formed according to the transfer etch process described with reference to FIG. 1D resulting in an undersized CD.

FIGS. 4A and 4B illustrate the actual structure and the resulting lithographic structure that is formed according to the transfer etch process described with reference to FIG. 1D resulting in profile damage.

FIGS. 5A to 5E illustrate a first preferred embodiment of the invention in which a protective film is utilized in forming a damascene structure.

DETAILED DESCRIPTION OF THE INVENTION

Figure 1A:
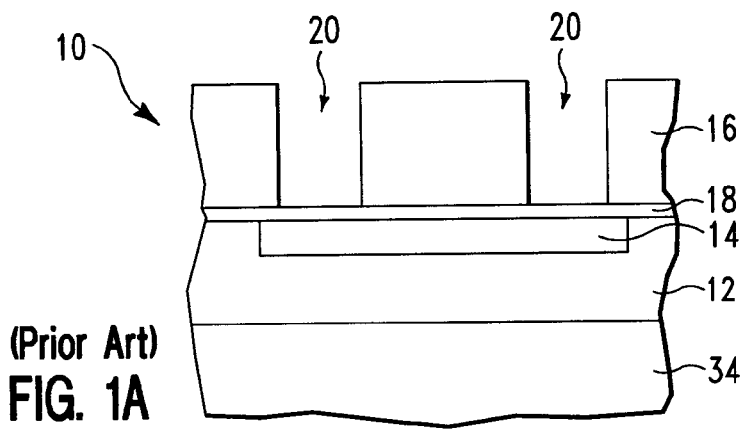
Figure 1B:
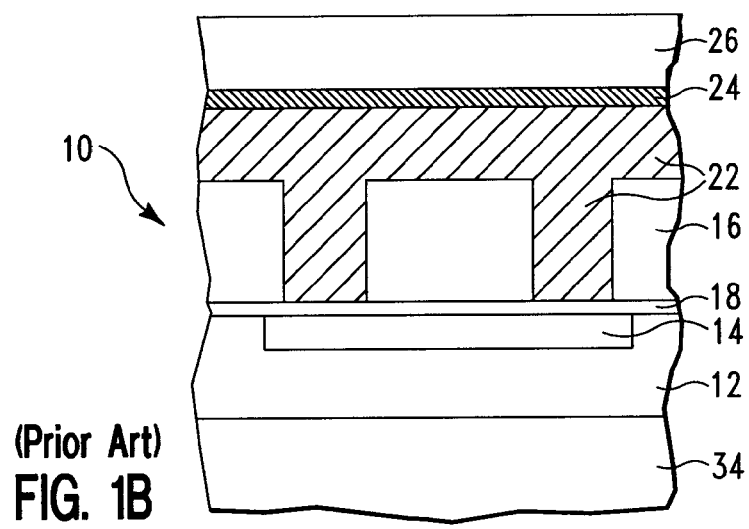
Figure 1C:
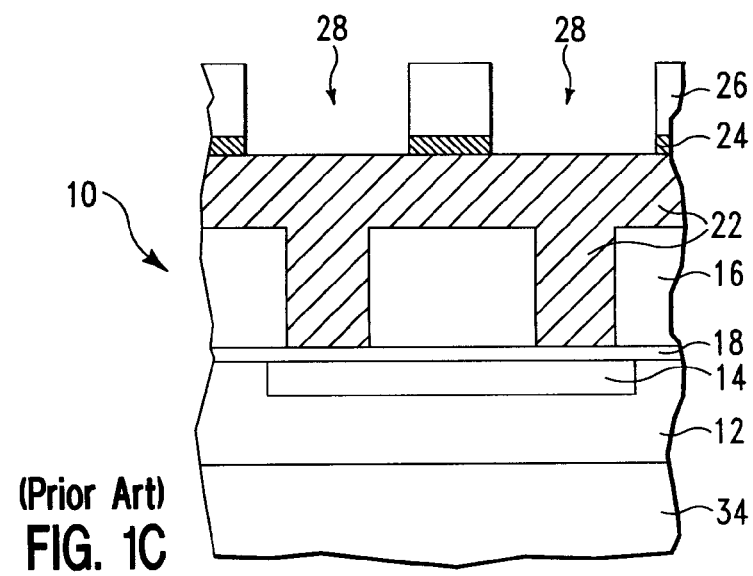

Referring now to FIGS. 5A through 5C, a first preferred embodiment of the invention will be described. The semiconductor structure shown in FIG. 5A comprises semiconductor wafer 134, a previous wiring level which comprises dielectric 112, metallization 114 and optional capping layer 118, and the next wiring level which begins with dielectric 116. The dielectric 116 has been conventionally patterned and etched to form via openings 130 extending down to optional capping layer 118 as shown in FIG. 5A.

Then, as shown in FIG. 5B, a high molecular weight polymer 136 is applied, preferably by spin coating. The high molecular weight polymer is chosen so that it does not enter the via openings 130. In other words, the high molecular weight polymer 136 lays on top of the dielectric 116 and via openings 130 and does not fill, partially or totally, the via openings 130. A polymer has a radius of gyration, Rg, which is proportional to $N^{1/2}$ and A where N is the number of units in the chain and A is the unit length of the polymer. Rg may be represented by the following equation:

$$Rg = <R^2>^{1/2}/6 = A\,N^{1/2}/6 \tag{1}$$

Figure 7:
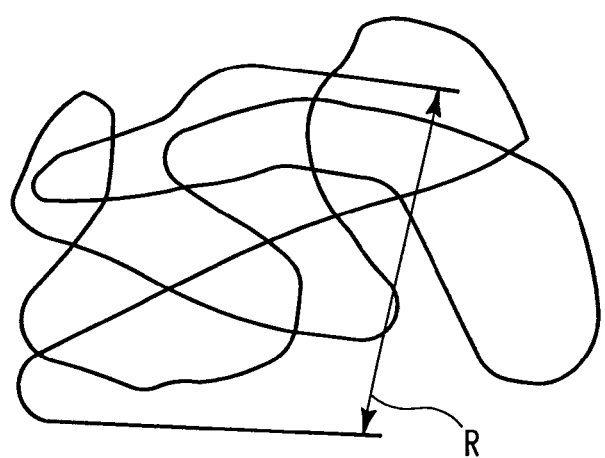
FIG. 7 is a schematical representation of a polymer coil having a radius R.

R is the end to end distance of the polymer coil as shown in FIG. 7. $<R^2>^{1/2}$ is the root mean square end to end distance of the polymer chain. For a randomly coiled polymer, the size of the polymer (diameter of the coil) is around twice of the Rg. However, the polymer coil will usually flatten a little bit during spin coating, thus the flattened polymer would exhibit a larger diameter (>2 Rg) on the wafer surface than the diameter of a spherically shaped coil (2 Rg). At the same time, the height of the polymer coil would be smaller than 2 Rg in the direction perpendicular to the wafer surface. The polymer size coated on the substrate must be chosen so that it has a dimension that is greater than the diameter of the via opening 130. For example, assume that Rg for a polymer with molecular weight of approximately 5,000 is about 2 nm. Thus, the polymer coated on a wafer would have a diameter size of around 5 nm on the wafer surface, and the polymer size perpendicular to the surface would be around 3 nm. Since the coil size of the polymer is proportional to the molecular weight (or N, the number of units), then, a polymer with a molecular weight of approximately 500,000 would have an Rg of about 20 nm and polymer coil size around 50 nm on the surface of the substrate. Thus, to prevent a polymer from entering or filling 50 nm via openings, the polymer should have a molecular weight of at least 500,000. Since the polymers are not in the ideal coil state and the polymer may have some extent of entanglement with neighboring chains, the approximation described above is only a rough estimation of the molecular weight. In the polymer solution, the polymer chains may be freely extended. To prevent the polymer filling the holes, choosing higher viscosity polymer solutions and using solvents which would maintain the polymer in the coil state are preferred in addition to the choice of higher molecular weight polymers.

Some polymers that are suitable for the present invention include, but are not limited to, polyacrylates, polymethacrylates, substituted and unsubstituted polystyrenes, substituted and unsubstituted polyvinylnaphthalenes, substituted and unsubstituted polyvinylanthracenes, cyclic olefin polymers, copolymers of cyclic olefin and maleic anhydride, copolymers containing maleic anhydride, substituted and unsubstituted polythiophenes, substituted and unsubstituted polyanilines, polyesters, polyacenaphthene, and novolacs. If antireflective property is desired for reflectivity control, absorbing functionality can be incorporated into the high molecular weight polymer solution by adding an absorbing compound or the functionality can be grafted onto the polymer chain. The typical absorbing functional groups for 248 nm exposure systems are substituted or unsubstituted anthracenes. The typical absorbing functional groups for 193 nm exposure systems are substituted or unsubstituted benzenes. The high molecular weight composition may also contain crosslinkers to crosslink the high molecular weight layer for preventing intermixing between the high molecular weight layer with an organic ARC (anti-reflective compound) layer, Si-ARC layer or photoresist layer. Suitable organic crosslinking agents include, but are not limited to: amine-containing compounds, epoxy-containing compounds, compounds containing at least two vinyl ether groups, allyl substituted aromatic compounds, compounds containing at least two or more diazonaphthoquinone sulfonic acid ester groups and combinations thereof. Preferred crosslinking agents are glycoluril compounds such as tetramethoxymethyl glycoluril, methylpropyltetramethoxymethyl glycoluril, and methylphenyltetramethoxymethyl glycoluril, available under the POWDERLINK trademark from Cytec Industries, Inc. Other preferred crosslinking agents include 2,6-bis(hydroxymethyl)-p-cresol. One example demonstrated was n-butanol treated poly(ethylene-alt-maleic anhydride) from Aldrich with molecular weight around 100,000-500,000. The poly(ethylene-alt-maleic anhydride) was treated with n-butanol at elevated temperature to open up the ring, at the same time to increase the molecular weight and to become soluble in alcohol. The viscous solution was diluted with 4-methyl-2-pentanol to form approximately a 10% solution. The polymer solution was spin-coated and baked on wafers containing different size of vias. No filling of the vias was found at the dimension of 70 nm.

If desired, the high molecular weight polymer 136 may be thinned by solvent strip or dry chemical etch (e.g., $CF_4$ and $O_2$). Thinning may be desirable because the high molecular weight and high viscosity solution may render the coated film too thick such that it is not suitable for the overall process. A hardmask layer 124 could then be applied to the high molecular weight polymer 136. The hardmask layer 124 may be a low temperature oxide such as CVD oxide or SiARC which is an antireflective compound comprising Si-containing polymers. Finally, photoresist 126 is applied and conventionally patterned for etching of the trench. The resulting structure thus far is shown in FIG. 5C.

Referring now to FIG. 5D, the trench 142 is conventionally etched leaving some remaining high molecular weight polymer 136. The remaining high molecular weight polymer 136 may be removed by a dry etch such as $H_2+O_2$ plasmas. The center of the trench 142 is completely devoid of the hard mask 124 and high molecular weight polymer 136.

Lastly, as shown in FIG. 5E, the optional capping layer 118 is opened in via openings 130 by conventional etching means, for example $CF_4$, $CHF_3$, $NF_3$, Ar, $O_2$, $N_2$, or $NH_3$.

At this point in the process, the article 100 would be sent on for further processing.

An advantage of the present invention is vertical surfaces 138 will be formed on the hard mask 124 and high molecular weight polymer 136 which will then be transferred into trench 142. Too, the high molecular weight polymer 136 protects the underlying via openings 130 during formation of the trench and there is no planarization material that needs to be removed from the via openings after processing. The semiconductor structure 100 shown in FIG. 5B should be compared to the semiconductor structures 10 shown in FIGS. 2 to 4 to appreciate the advantages of the present invention. In the conventional process, all remaining organic planarizing material 22 inside the vias needs to be removed before the capping layer 18 is removed after the trench etch is completed. Removal of the remaining organic planarizing material 22 will produce an undesired etch profile as shown in FIGS. 2B, 3B and 4B. Since the high molecular weight polymer will not enter into the via according to the present invention, it will not need to be removed in order to etch the capping layer 18. The capping layer etch can be executed right after trench etch. Metallization 14 is protected by capping layer 118 until after trench etch. A high etch selectivity capping layer material is necessary for the first embodiment of the invention as shown in FIGS. 5A to 5E in order to protect the metallization 14 during the trench etch process.

Figure 6A:
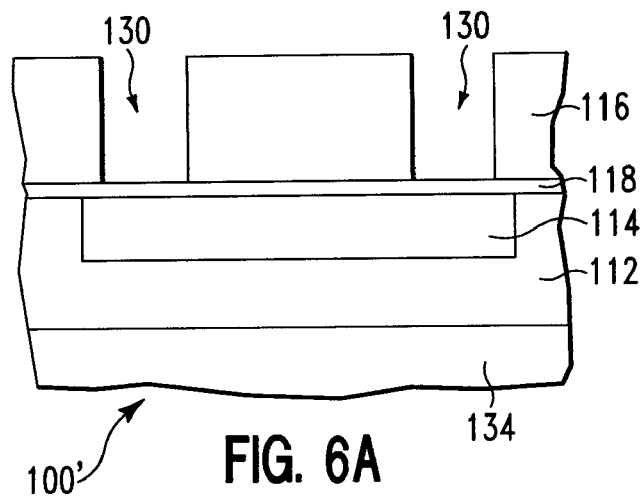
FIGS. 6A to 6E illustrate a second preferred embodiment of the invention in which a protective film is utilized in forming a damascene structure.
Figure 6B:
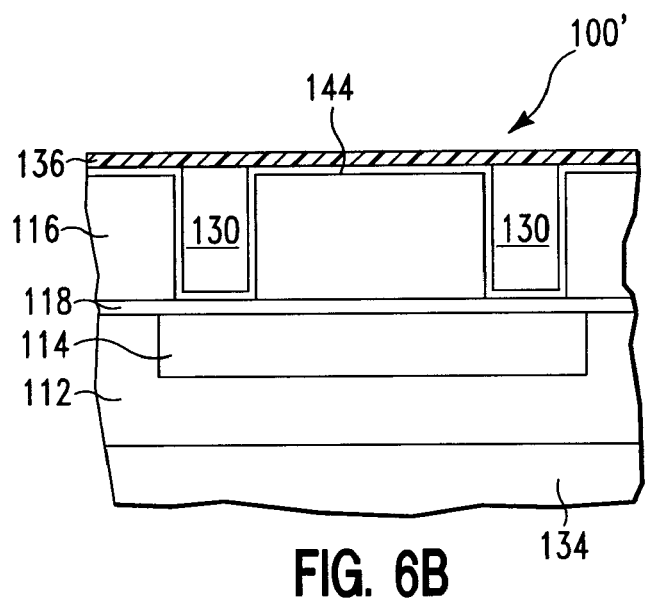

Referring now to FIGS. 6A to 6E, there is illustrated a second preferred embodiment of the present invention. The second preferred embodiment of the invention is similar to the first preferred embodiment of the invention illustrated in FIGS. 5A to 5E except that the second preferred embodiment of the invention includes a protective liner in the via openings which protects the underlying capping layer 118 during via etch and trench etch. FIG. 6A is essentially identical to FIG. 5A. In FIG. 6B, a protective liner 144, preferably a CVD oxide or CVD nitride is blanket deposited in the via openings 130 by conventional means. Thereafter, the layer of high molecular weight polymer 136 is deposited. Again, the high molecular weight polymer is selected so that it does not enter or otherwise partially or totally fill the via openings 130.

Figure 6C:
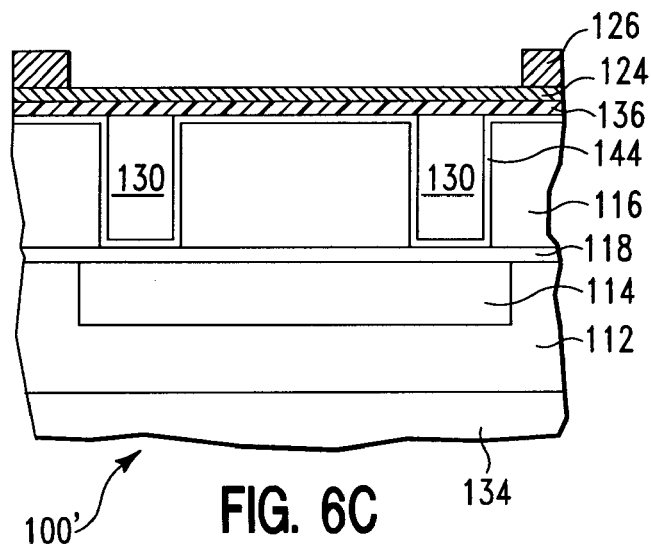

Then, as shown in FIG. 6C, the layer of high molecular weight polymer is optionally thinned followed by deposition of hard mask 124 and patterned photoresist 126.

Figure 6D:
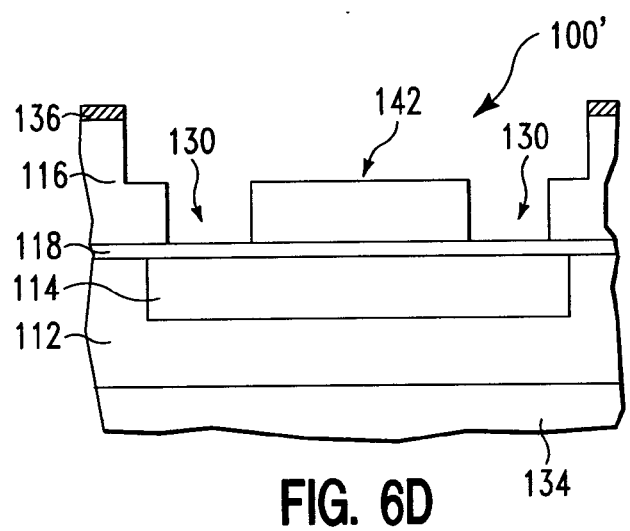

The trench 142 is etched as shown in FIG. 6D which removes the protective liner 144 that was on the dielectric material 116 but does not otherwise disturb the protective liner 144 within the via openings 130.

Figure 6E:
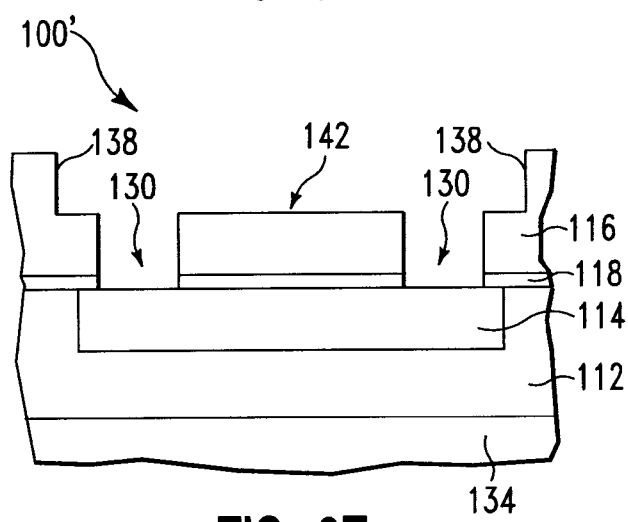

Lastly, as shown in FIG. 6E, the protective liner 116 is removed by dry etching likes $CF_4$ and the optional capping layer 118 is opened in via openings 130 by conventional etching means.

Figure 8:
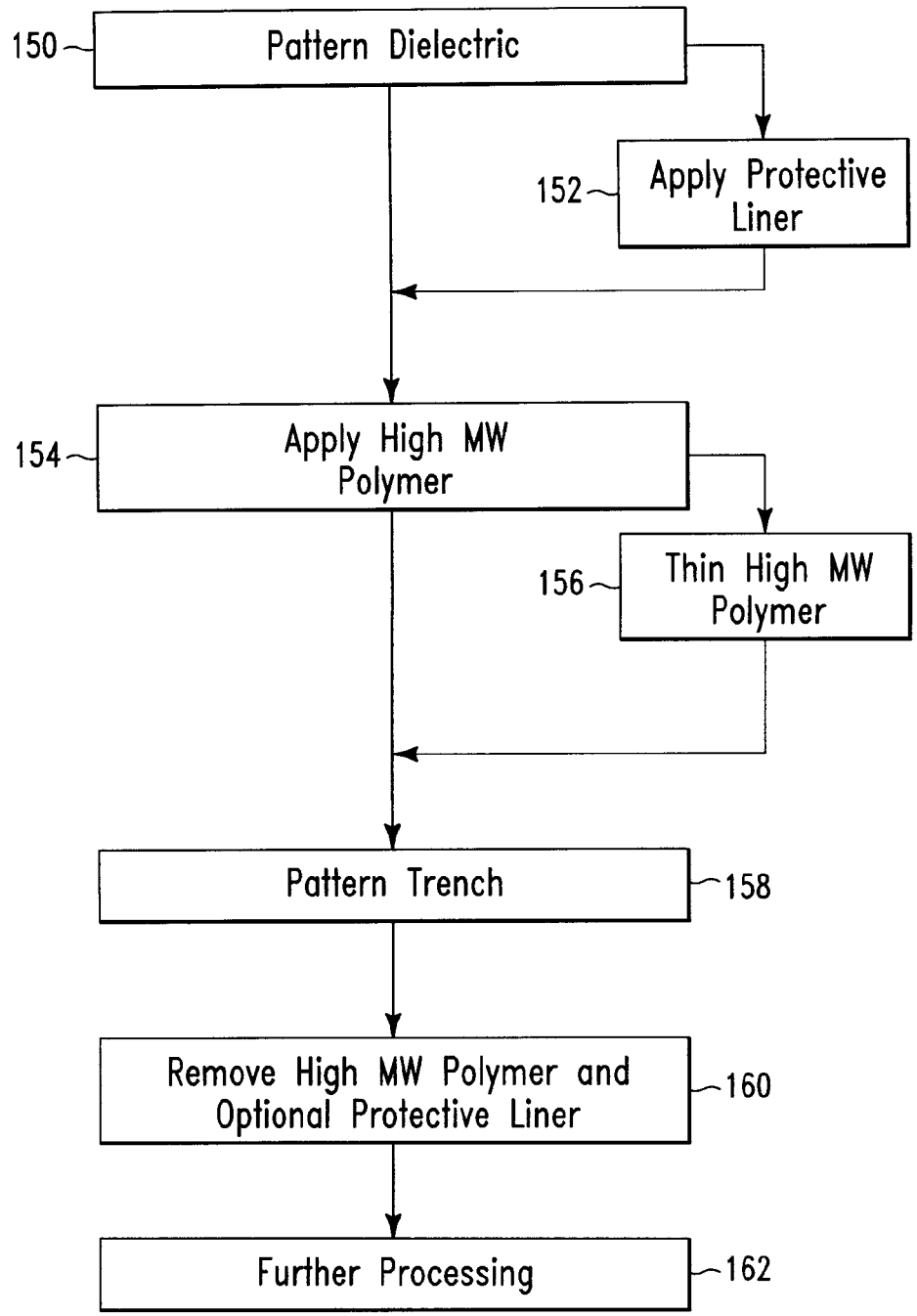
FIG. 8 is a flow chart illustrating the methods according to the present invention.

The methodology of the present invention is illustrated in FIG. 8. A semiconductor wafer is received for damascene processing and the first step in the process is to pattern dielectric material on the semiconductor wafer as represented by step 150.

In one preferred embodiment of the invention, an optional protective liner is blanket applied at least in the via openings 130 but usually over the entire wafer as represented by step 152.

In the next step, step 154, which may occur after step 152 if optional step 152 is utilized, otherwise after step 150, a high molecular weight polymer is applied to the semiconductor wafer. The high molecular weight polymer is selected so that it does not enter the via openings 130. In other words, the high molecular weight polymer does partially or totally fill the via openings 130.

The high molecular weight polymer may be thinned if desired as represented by step 156. If thinning of the high molecular weight polymer is not required, this step may be skipped and the process may proceed directly to step 158.

In step 158, the trench is etched to form a trench pattern.

Thereafter, as represented by step 160, the high molecular weight polymer and protective liner, if present, are removed and the capping layer, if present, is opened.

Finally, the semiconductor wafer is sent for further processing as represented by step 162.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method for the formation of features in a damascene process, the method comprising the steps of:
   (a) providing a semiconductor wafer having a dielectric layer thereon;
   (b) forming vias in the dielectric layer;
   (c) applying a layer of high molecular weight polymer over the dielectric layer, the high molecular weight layer covering the vias but not entering the vias;
   (d) applying a photoresist material to the high molecular weight layer;
   (e) patterning the photoresist material so as to expose openings over portions of the high molecular weight layer;
   (f) etching the high molecular weight layer and dielectric layer through the openings to form a trench; and
   (g) removing the remaining photoresist and high molecular weight layer from the dielectric material to form dual damascene openings in the dielectric material.

2. The method of claim 1 wherein there is a capping layer underneath the dielectric layer and further comprising the step (h) of removing the capping layer from the openings in the dielectric layer.

3. The method of claim 1 wherein the high molecular weight layer comprises a material selected from the group consisting of polyacrylates, polymethacrylates, substituted and unsubstituted polystyrenes, substituted and unsubstituted polyvinylnaphthalenes, substituted and unsubstituted polyvinylanthracenes, cyclic olefin polymers, copolymers of cyclic olefin and maleic anhydride, copolymers containing maleic anhydride and alkylene, substituted and unsubstituted polythiophenes, substituted and unsubstituted polyanilines, polyesters, polyacenaphthene, novolacs and fused aromatic novolacs.

4. The method of claim 1 wherein the high molecular weight layer has a diameter of the polymer coil equal to or greater than a diameter of the vias.

5. The method of claim 1 further comprising the step between step (b) and (c) of applying a protective liner to the dielectric material including in the vias.

6. The method of claim 5 further comprising the step between steps (f) and (g) of removing the protective liner.

7. The method of claim 5 wherein step (g) further comprises removing the protective liner.

8. The method of claim 5 wherein the protective liner comprises an oxide deposited by chemical vapor deposition.

9. The method of claim 2 wherein in step (h), removing is by stripping with a plasma.

10. The method of claim 9 wherein the plasma is an $H_2+O_2$ plasma.

11. The method of claim 1 further comprising the step between steps (c) and (d) of thinning the high molecular weight polymer.

12. The method of claim 11 wherein the step of thinning is by applying a solvent to the high molecular weight polymer.

13. The method of claim 11 wherein the step of thinning is by applying dry etch to the high molecular weight polymer.

14. The method of claim 13 wherein the dry etch is $CF4+O2$ gases.

15. A method for the formation of features in a damascene process, the method comprising the steps of:
   (a) providing a semiconductor wafer having a dielectric layer thereon;
   (b) forming vias in the dielectric layer;
   (c) applying a layer of high molecular weight polymer over the dielectric layer, the high molecular weight layer having a diameter of the polymer coil equal to or greater than a diameter of the vias;
   (d) applying a photoresist material to the high molecular weight layer;
   (e) patterning the photoresist material so as to expose openings over portions of the high molecular weight layer;
   (f) etching the high molecular weight layer and dielectric layer through the openings to form a trench; and
   (g) removing the remaining photoresist and high molecular weight layer from the dielectric material to form dual damascene openings in the dielectric material.

16. The method of claim 15 wherein the high molecular weight layer comprises a material selected from the group consisting of polyacrylates, polymethacrylates, substituted and unsubstituted polystyrenes, substituted and unsubstituted polyvinylnaphthalenes, substituted and unsubstituted polyvinylanthracenes, cyclic olefin polymers, copolymers of cyclic olefin and maleic anhydride, copolymers containing maleic anhydride and alkylene, substituted and unsubstituted polythiophenes, substituted and unsubstituted polyanilines, polyesters, polyacenaphthene, novolacs and fused aromatic novolacs.

17. The method of claim 1 further comprising the step between step (b) and (c) of applying a protective liner to the dielectric material including in the vias.

18. The method of claim 17 further comprising the step between steps (f) and (g) of removing the protective liner.

19. The method of claim 17 wherein step (g) further comprises removing the protective liner.

20. The method of claim 17 wherein the protective liner comprises an oxide deposited by chemical vapor deposition.

* * * * *